United States Patent
Chen et al.

(10) Patent No.: US 10,605,861 B2
(45) Date of Patent: Mar. 31, 2020

(54) TEST DEVICE FOR TESTING INTEGRATED CIRCUIT

(71) Applicant: REALTEK SEMICONDUCTOR CORPORATION, Hsinchu (TW)

(72) Inventors: Po-Lin Chen, Chiayi County (TW); Chun-Yi Kuo, Taipei (TW); Ying-Yen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 70 days.

(21) Appl. No.: 16/142,141

(22) Filed: Sep. 26, 2018

(65) Prior Publication Data
US 2019/0120901 A1  Apr. 25, 2019

(30) Foreign Application Priority Data
Oct. 23, 2017 (TW) .............................. 106136315 A (51) Int. Cl.
*G01R 31/28* (2006.01)
*G01R 31/317* (2006.01)
*G01R 31/3177* (2006.01)

(52) U.S. Cl.
CPC ... *G01R 31/31727* (2013.01); *G01R 31/3177* (2013.01); *G01R 31/31705* (2013.01)

(58) Field of Classification Search
CPC ........ G01R 31/31727; G01R 31/31705; G01R 31/3177
See application file for complete search history.

(56) References Cited

U.S. PATENT DOCUMENTS

| | | | |
|---|---|---|---|
| 6,532,560 B1 * | 3/2003 | Miyake | G01R 31/2882 327/159 |
| 9,091,726 B1 * | 7/2015 | Regner | G01R 31/31727 |
| 9,606,172 B2 | 3/2017 | Chen et al. | |
| 2016/0109515 A1 * | 4/2016 | Sharda | G01R 31/31705 714/729 |

FOREIGN PATENT DOCUMENTS

TW    201541103    11/2015

OTHER PUBLICATIONS

Taiwan Intellectual Property Office, "Office Action", dated Jul. 30, 2018 Summary of the TW OA letter: (1) Typo in paragraph [0004] should be corrected. (2) Claims 1 and 6 are indefinite and thus should be amended. (3) Claims 1-6 and 10 are obvious to those of ordinary skill in the art due to the disclosure of TW 201541103A.

* cited by examiner

*Primary Examiner* — Christine T. Tu
(74) *Attorney, Agent, or Firm* — WPAT, PC (57) ABSTRACT

The present invention discloses a test device for testing an integrated circuit. An embodiment of the test device includes an on-chip-clock controller (OCC), a pulse debugging circuit and a register circuit. The OCC is configured to generate an output clock according to an input clock, in which the output clock is for testing a circuitry under test (CUT) that is included in the test device. The pulse debugging circuit is configured to generate a pulse record according to a pulse number of the output clock, in which the pulse record is used to find out whether a test status dependent upon the output clock is abnormal. The register circuit is configured to store and output the pulse record according to a reliable clock.

20 Claims, 8 Drawing Sheets

TEST DEVICE FOR TESTING INTEGRATED CIRCUIT

BACKGROUND OF THE INVENTION

1. Field of the Invention

The present invention relates to a test device, especially to a test device for testing an integrated circuit.

2. Description of Related Art

As the development of semiconductor processes moves on, the circuit operation frequency of system-on-a-chip (SoC) design climbs up. In order to verify the function and the performance of a circuitry under test (CUT), in addition to a basic scan-based test that is used to verify whether the CUT has any malfunction due to manufacturing detects, an at-speed test is used to verify whether the CUT can operate at a rated frequency. However, in general, low-cost automatic test equipment (ATE) is unable to provide a clock (i.e., a clock signal) having a frequency as high as the above-mentioned rated frequency; even though some ATE is capable of providing a high-frequency clock, after the ATE outputs the high-frequency clock to the CUT through an input/output pad (I/O pad), there is no proper way to check whether the waveform of the high-frequency clock remains correct. These problems lead to the difficulty in carrying out the at-speed test.

In recent years, some technique uses a clock from an on-chip phase-locked loop (PLL), rather than an external apparatus, as the clock source for the at-speed test and adds an adjustable on-chip-clock controller (OCC) to an SoC circuit to provide an at-speed clock having clock pulses of a certain amount necessary for the at-speed test. This technique allows the at-speed test to be carried out in a verification flow of SoC design and provides a reliable test result.

However, in a procedure of executing the at-speed test with the OCC, if the test result indicates failure, it is hard for a tester to ascertain what the problem is and/or the debug work is very complicated. In comparison with ATE capable of verifying the correctness of the pattern of a signal inputted into the CUT, the test using the OCC may encounter more debug difficulties due to the following circumstances:

(1) It is hard for a tester to verify whether the failure in test is caused by the on-chip PLL failing to output a clock properly. Generally, the tester should provide an at-speed test pattern for each clock domain having an OCC again, so as to check which clock domain failing to pass the at-speed test.
(2) It is hard for a tester to verify whether a number of clock pulses outputted by the OCC is correct.
(3) The signal isolation of the on-chip PLL is not good enough, which leads to an at-speed test pattern changing the original setting of the on-chip PLL during the at-speed test; consequently the frequency of the on-chip PLL's clock transmitted to the OCC will be incorrect (e.g., too fast) or none of the on-chip PLL's clock will be provided for the OCC, and thus the at-speed test will not pass.

Since the current arts are not good enough for debug, in the aforementioned circumstances, especially circumstances (2) and (3), the verification is very hard to be done, and this leads to the great increase of verification time and cost.

SUMMARY OF THE INVENTION

In view of the problem of the prior arts, an objective of the present invention is to provide an IC test device capable of making improvements over the prior arts.

An embodiment of the test device of the present invention includes an on-chip-clock controller (OCC), a pulse debugging circuit and a register circuit. The OCC is configured to generate an output clock according to an input clock, in which the output clock is for testing a circuitry under test (CUT) included in the test device. The pulse debugging circuit is configured to generate a pulse record according to a pulse number of the output clock, in which the pulse record is used to determine whether a test status dependent upon the output clock is abnormal. The register circuit is configured to store and output the pulse record according to a reliable clock.

Another embodiment of the test device of the present invention includes an on-chip-clock controller (OCC) and a clock selecting circuit. The OCC is configured to generate an output clock according to an input clock, in which the output clock is for testing a circuitry under test (CUT) included in the test device. The clock selecting circuit is configured to generate the input clock according to one of a plurality of clocks, in which the plurality of clocks includes a chip clock and a reliable clock or the plurality of clocks includes two different chip clocks.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a test device for testing an integrated circuit. The test device is capable of verifying whether a pulse number of a test clock is correct, verifying whether a frequency of the test clock is correct, and lowering the frequency of the test clock for a following test. Accordingly, the present invention can shorten the time for testing an integrated circuit by a process including test development and/or a debugging procedure and thereby reduce the cost.

Figure 1:
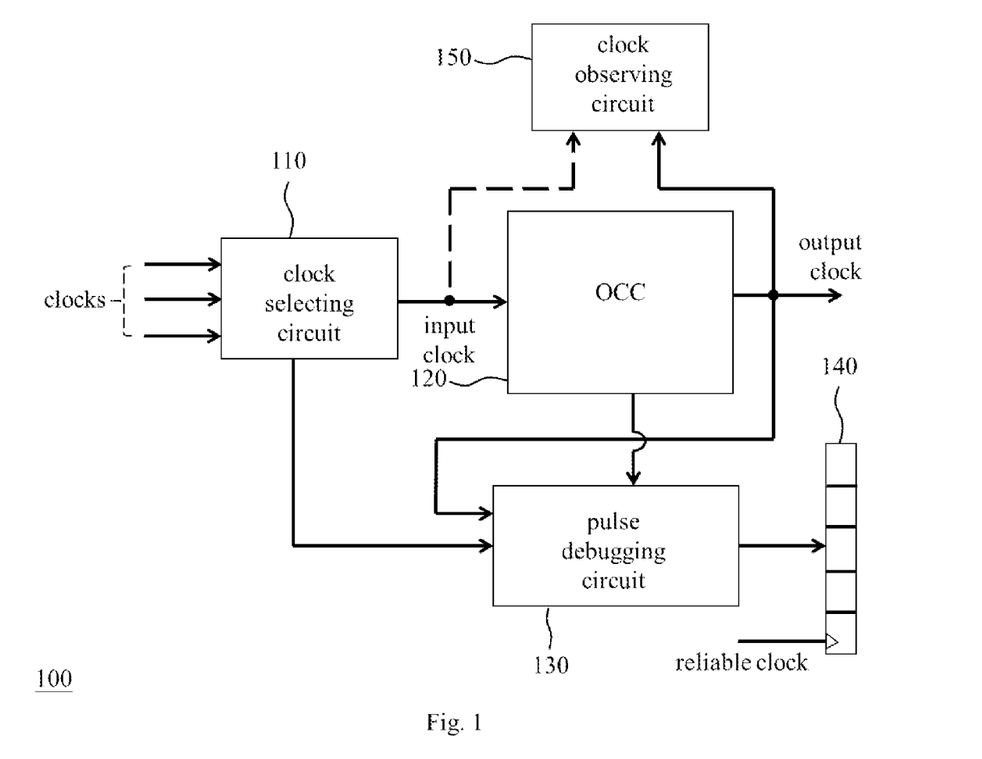
FIG. 1 shows an embodiment of the test device of the present invention.

FIG. 1 shows an embodiment of the test device of the present invention. The test device 100 of FIG. 1 (e.g., an integrated circuit) includes a clock selecting circuit 110, an on-chip-clock controller (OCC) 120, a pulse debugging circuit 130, a register circuit 140 and a clock observing circuit 150. The clock selecting circuit 110 is configured to generate an input clock according to one of a plurality of clocks including a chip clock. The chip clock is generated by or originated from an on-chip phase-locked loop (PLL) that is included in a circuitry under test (CUT). The CUT is included in the test device 100, and the CUT includes one or more circuitry part(s) (or clock domain(s)), each of which can be tested in the test manner of the present disclosure. The OCC 120 is configured to generate an output clock according to the input clock, and the output clock is for testing the CUT. The pulse debugging circuit 130 is configured to generate a pulse record according to a pulse number of the output clock (i.e., a number of cycles of the output clock). The register circuit 130 is configured to store and output the pulse record according to a reliable clock (e.g., a clock from automatic test equipment (ATE), or a clock from a crystal oscillator), in which the pulse record is used to determine whether a test status (e.g., a test result of an at-speed test) dependent upon the output clock is abnormal. The clock observing circuit 150 is configured to determine or assist in determining whether the frequency of the output clock is correct, and is optionally configured to determine or assist in determining whether the frequency of the input clock is correct. For instance, the clock observing circuit 150 is configured to generate a frequency-divided clock according to the output clock/input clock and output the frequency-divided clock to an apparatus (e.g., ATE) so that the apparatus can determine whether the frequency of the output clock/input clock is correct. For another instance, the clock observing circuit 150 is configured to divide the frequency of the output clock to generate a frequency-divided clock and then sample the frequency-divided clock, so as to compare the sampled result with a predetermined value and thereby determine whether the frequency of the output clock is correct in accordance with the comparison result.

In an embodiment of the present invention, each of the clock selecting circuit 110 and the clock observing circuit 150 in FIG. 1 is optional; in another embodiment of the present invention, both the pulse debugging circuit 130 and the register circuit 140 in FIG. 1 are optional. These embodiments and the modification thereof indicate the flexibility of carrying out the present invention.

Figure 2:
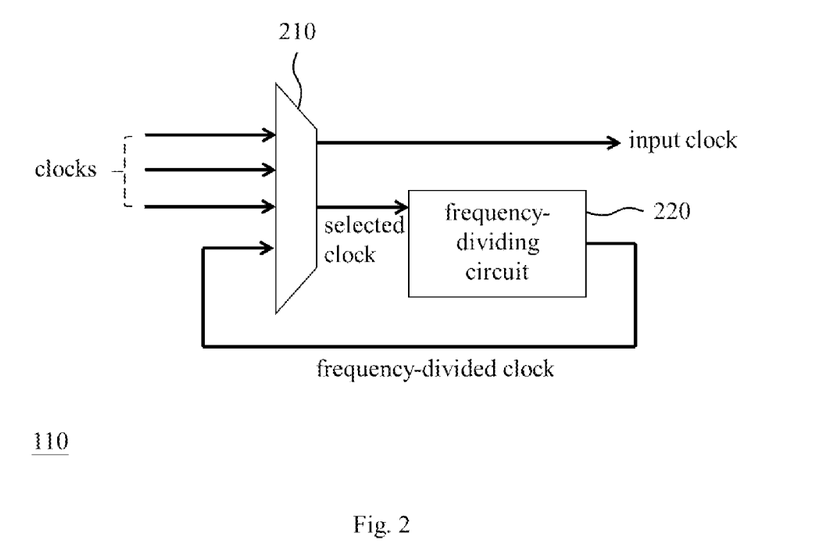
FIG. 2 shows an embodiment of the clock selecting circuit of FIG. 1.
Figure 3:
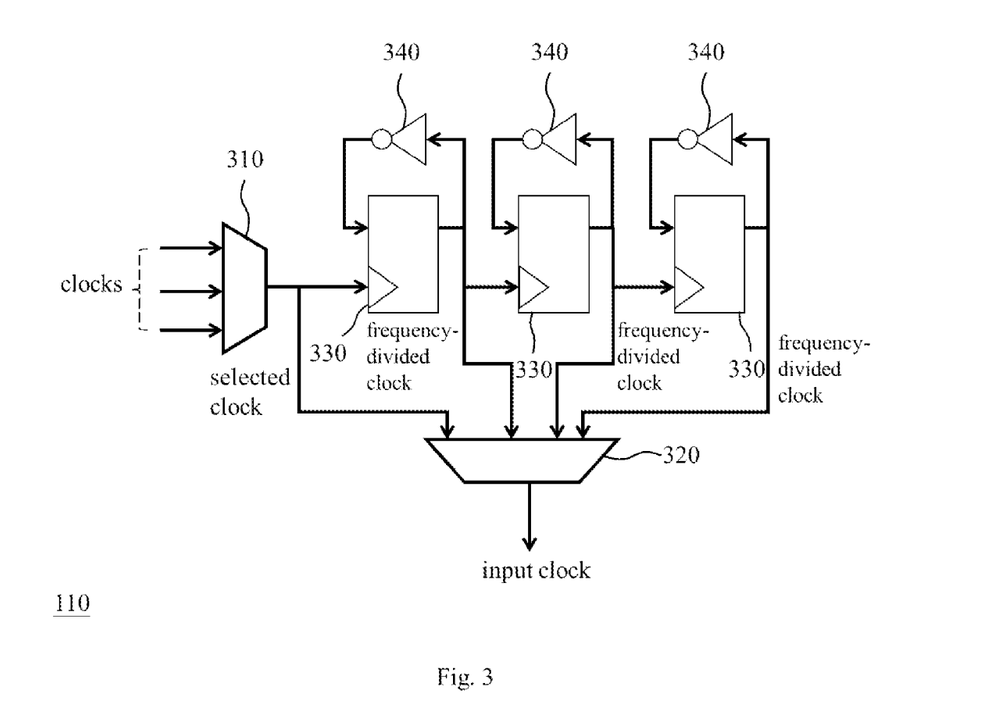
FIG. 3 shows another embodiment of the clock selecting circuit of FIG. 1.

FIG. 2 shows an embodiment of the clock selecting circuit 110 of FIG. 1. As shown in FIG. 2, the clock selecting circuit 110 includes a selecting circuit 210 and a frequency-dividing circuit 220. An embodiment of the selecting circuit 210 includes at least one multiplexer(s) or the equivalent thereof, and the selecting circuit 210 is configured to select one of the aforementioned plurality of clocks as a selected clock. The frequency-dividing circuit 220 is configured to divide the frequency of the selected clock to generate at least one frequency-divided clock(s); however, if there is no need to divide the frequency of the selected clock, the frequency-dividing circuit 220 is optional. The selecting circuit 210 can be further configured to output the selected clock as the aforementioned input clock, or output one of the at least one frequency-divided clock(s) as the input clock. FIG. 3 shows an exemplary implementation of the clock selecting circuit 110 of FIG. 2. In FIG. 3, the selecting circuit 210 includes a multiplexer 310 and a multiplexer 320. The multiplexer 310 is configured to select one of the said plurality of clocks as the selected clock, and the multiplexer 320 is configured to output the selected clock from the multiplexer 310 as the input clock or output one of the frequency-divided clocks as the input clock. In addition, the frequency-dividing circuit 220 of FIG. 3 includes a plurality of flip-flops 330 and a plurality of inverters 340 that are configured to generate the said frequency-divided clocks according to the selected clock from the multiplexer 310. Since each of the selecting circuit 210 (including the multiplexers 310, 320) and the clock-dividing circuit 220 (including the flip-flops 330 and the inverters 340) alone is well known in this industrial field, the detail is omitted here.

In an exemplary implementation, the clock selecting circuit 110 outputs the aforementioned selected clock as the aforementioned input clock first, and then outputs the aforementioned frequency-divided clock as the input clock after (in response to) the aforementioned pulse record indicating that a test status (e.g., a test result of an at-speed test) dependent upon the output clock generated according to the selected clock is abnormal; accordingly, if a following test status dependent upon the output clock generated according to the frequency-divided clock is normal, a tester can determine that the previous abnormal test status is caused by an over high frequency of the input clock. In another exemplary implementation, the plurality of clocks received by the clock selecting circuit 110 include two different chip clocks, and the selecting circuit 210 selects one of the two different chip clocks (hereafter "first chip clock") as the input clock first and then selects the other one of the two different chip clocks (hereafter "second chip clock") as the input clock after (in response to) the aforementioned pulse record indicating that a test status (e.g., a test result of an at-speed test) dependent upon the output clock generated according to the first chip clock is abnormal; accordingly, if a following test status dependent upon the output clock generated according to the second chip clock is normal, a tester can determine that the previously selected chip clock (i.e., the first chip clock) is inappropriate/problematic. In a further exemplary implementation, the plurality of clocks includes a chip clock and a reliable clock (e.g., a clock outputted by ATE, or a clock outputted by a crystal oscillator), the frequency of the chip clock is higher than the frequency of the reliable clock, and the selecting circuit 210 selects the chip clock as the input clock first and then selects the reliable clock as the input clock after (in response to) the aforementioned pulse record indicating that a test status (e.g., a test result of an at-speed test) dependent upon the output clock generated according to the chip clock is abnormal; accordingly, if a following test status dependent upon the output clock generated according to the reliable clock is normal, a tester can determine that the chip clock is inappropriate/problematic or the frequency of the chip clock is too high.

Figure 4:
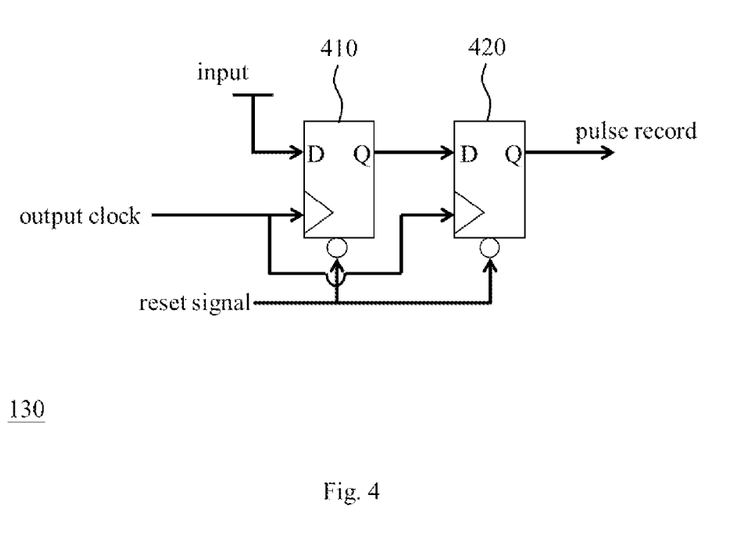
FIG. 4 shows an embodiment of the pulse debugging circuit of FIG. 1.

FIG. 4 shows an embodiment of the pulse debugging circuit 130 of FIG. 1. The pulse debugging circuit 130 of FIG. 4 includes at least two shift registers 410, 420 connected in series, and they are configured to verify whether the OCC 120 outputs at least two clock pulses (e.g., at least two pulses of an at-speed clock). Each of the shift registers 410, 420 can be realized by a D-type flip-flop or the equivalent thereof. Each of the shift registers 410, 420 has an output Q be equivalent to an input D in accordance with a trigger (e.g., a rising edge) of the output clock of the OCC 120, in which the input D of the shift register 410 is a given input (e.g., "1") while the input D of the shift register 420 is the output Q of the shift register 410. Additionally, the shift registers 410, 420 are reset according to a reset signal which could be a reverse signal of a scan enablement signal or the equivalent thereof. When the aforementioned CUT is in a shift mode (i.e., when the CUT is loaded with a test pattern or the CUT unloads a test response), the signal level of the reset signal (e.g., "0") remains low, so that the signal levels of the outputs Q (e.g., "0") of the shift registers 410, 420 are kept low; when the aforementioned CUT is in a capture mode, the signal level of the reset signal (e.g., "1") remains high, so that the shift registers 410, 420 can transmit their inputs D in response to the output clock of the OCC 120. In the capture mode, if the OCC 120 normally outputs at least two clock pulses, the output Q of the shift register 420 will be equivalent to the input D of the shift register 410, and thus a tester can determine that a test status dependent upon the output clock of the OCC 120 is normal, that is to say that both the input clock received by the OCC 120 and the output clock outputted by the OCC 120 are normal); in the meantime, if the output clock of the OCC 120 is the aforementioned chip clock, a tester can determine that the operation of an on-chip PLL generating the chip clock is normal.

Figure 5:
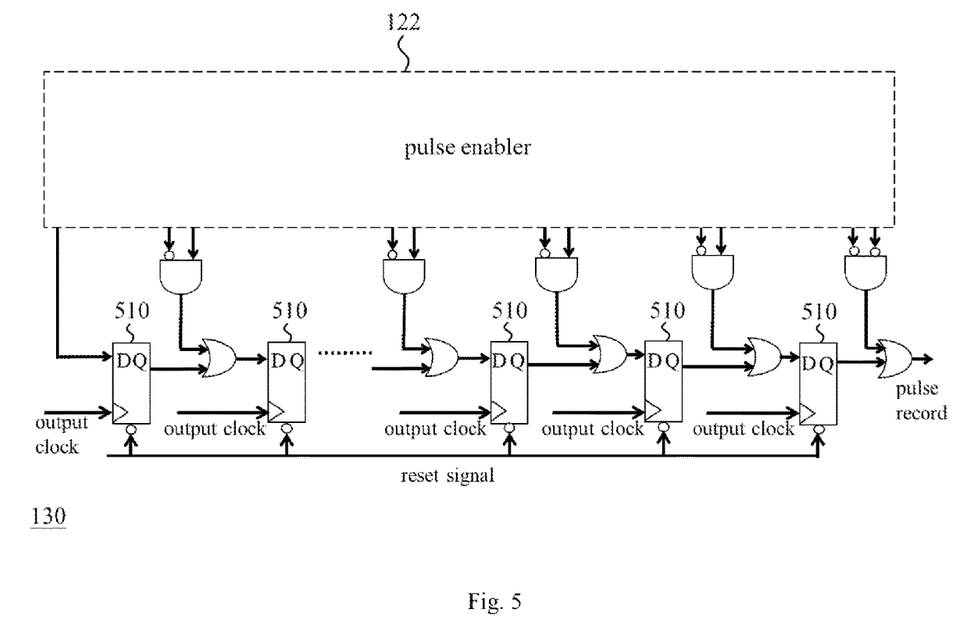
FIG. 5 shows another embodiment of the pulse debugging circuit of FIG. 1.

FIG. 5 shows another embodiment of the pulse debugging circuit 130 of FIG. 1; in this embodiment, a pulse enabler 122 is not included in the pulse debugging circuit 130 and therefore the pulse enabler 122 is depicted in dashed lines. As shown in FIG. 5, the pulse debugging circuit 130 includes a plurality of cascaded shift registers 510, AND gates, inverting components (i.e., the bubbles in FIG. 5) at the input terminals of the AND gates, and OR gates. The operation of each shift register 510 is similar to that of the aforementioned shift register. In FIG. 5, the value of the input D of each shift register 510 is controlled by the pulse enabler 122. The pulse enabler 122 could be included in the OCC 120 or independent of the OCC 120, and is configured to determine the value of the input D of each shift register 510 being a first value (e.g., "1") or a second value (e.g., 0"); therefore, through the operation of the circuit of FIG. 5, the pulse enabler 122 is able to control the value of the output Q of each shift register 510 being the first value (e.g., "1") or the second value (e.g., "0"), so as to have the pulse debugging circuit 130 generate the aforementioned pulse record. For instance, in FIG. 5, by the control of the pulse enabler 122, the third shift register 510 from the right has an input D of the value "1" while each of the other shift registers 510 has an input D of the value "0"; afterward, if the OCC 120 normally outputs three clock pulses, after the circuit of FIG. 5 operates in response to the three clock pulses, the value of the output Q of the last shift register 510 from the right in FIG. 5 will be "1", and this indicates that the test status dependent upon the output clock of the OCC 120 is normal (i.e., not abnormal).

Figure 6:
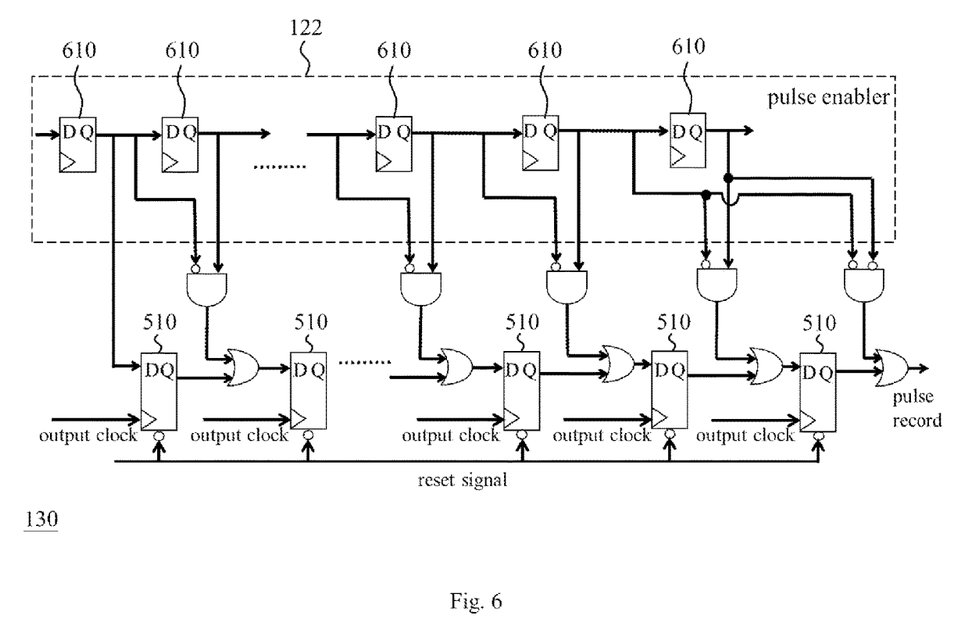
FIG. 6 shows an embodiment of the pulse enabler of FIG. 5.

FIG. 6 shows an embodiment of the pulse enabler 122 of FIG. 5. As shown in FIG. 6, the pulse enabler 122 includes a plurality of shift register 610 connected in series. Each shift register 610 receives a reliable clock (e.g., a clock outputted by ATE, or a clock outputted by a crystal oscillator) (not shown in the figure) through a clock receiving terminal (i.e., the triangle of the shift register 610), and receives the input D and outputs the output Q according to the reliable clock; meanwhile, in the pulse debugging circuit 130, each AND gate outputs a signal having a value corresponding to the values of the signals (i.e., the input D and the output Q) transmitted by a shift register 610, and each OR gate outputs a signal having a value corresponding to the output of an AND gate and the output Q of a shift register 510, in which the signal outputted by each OR gate except the last OR gate is the input D of a subsequent shift register 510. Since each of a shift register, an AND gate, an inverting component at the input terminal of an AND gate, and an OR gate in the embodiment of FIG. 6 alone is well known in this industrial field, people of ordinary skill can appreciate the circuit operation of FIG. 6 according to FIG. 6 itself, and thus the detail is omitted here. It should be noted that for some specific test the output clock of the OCC 120 includes no pulse (i.e., the OCC 120 does not output any clock pulse); therefore the input D of each shift register 610 will be "0", and the input D and the output Q of each shift register 510 will be "0"; in this case, in order to prevent the identical outputs (i.e., "0") of the shift registers 510 from misleading one into determining that a test result dependent upon the output clock is abnormal, the two input terminals of the last AND gate at the most right side in FIG. 6 are equipped with inverting components, so that this AND gate will output "1" under the specific test and the last OR gate at the most right side in FIG. 6 will output "1" indicating that the test status dependent upon the output clock is normal.

Figure 7:
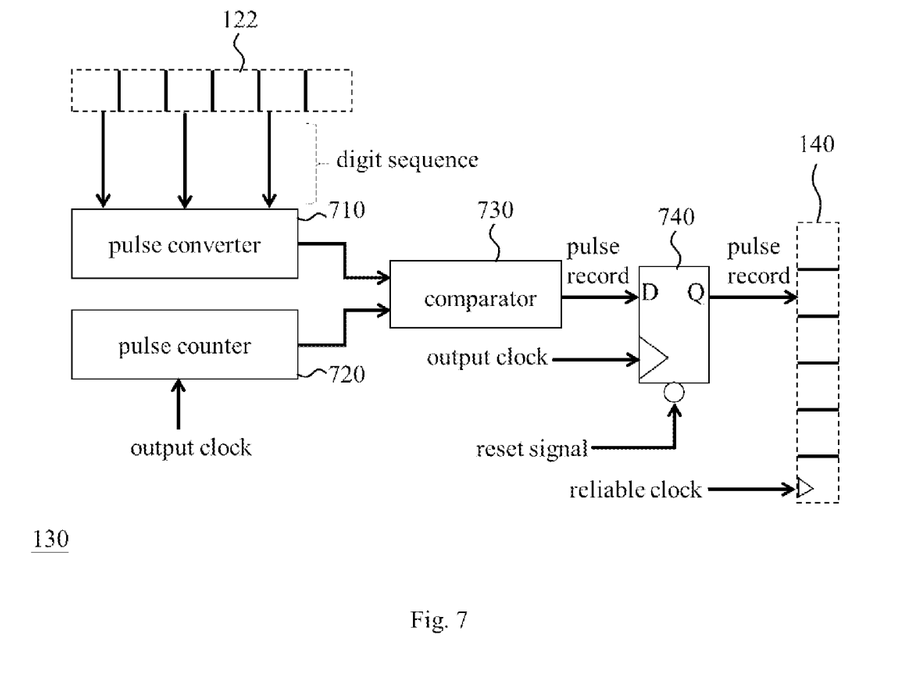
FIG. 7 shows another embodiment of the pulse enabler of FIG. 5.

FIG. 7 shows another embodiment of the pulse debugging circuit 130 of FIG. 1; in this embodiment, the pulse enabler 122 and the register circuit 140 are not included in the pulse debugging circuit 130, so they are depicted in dashed lines. As shown in FIG. 7, the pulse debugging circuit 130 includes a pulse converter 710, a pulse counter 720, a comparator 730 and a register 740. The pulse converter 710 is configured to convert a digit sequence outputted by the pulse enabler 122 into a predetermined pulse number; for instance, if the digit sequence includes N "1", the predetermined pulse number is N (i.e., the amount of "1" in the digit sequence is N). the pulse counter 720 is configured to count the pulse number of the output clock of the OCC 120, and thereby generates a counted number. The comparator 730 is configured to compare the predetermined pulse number with the counted number and thereby generate the pulse record. When the predetermined pulse number matches (e.g., is equal to) the counted number, the pulse record will indicate that the test status dependent upon the output clock of the OCC 120 is normal; or else the pulse record will indicate that the test status is abnormal. The register 740 is configured to capture the pulse record and output the pulse record to the register circuit 140 according to the output clock of the OCC 120; the register 740 is similar to the aforementioned shift register, and can be reset in response to a reset signal. Since each of the pulse converter 710, the pulse counter 720, the comparator 730 and the register 740 alone is well known in this industrial field, people of ordinary skill in the art can appreciate the circuit operation of FIG. 7 according to FIG. 7 itself, and thus the detail is omitted here.

Figure 8:
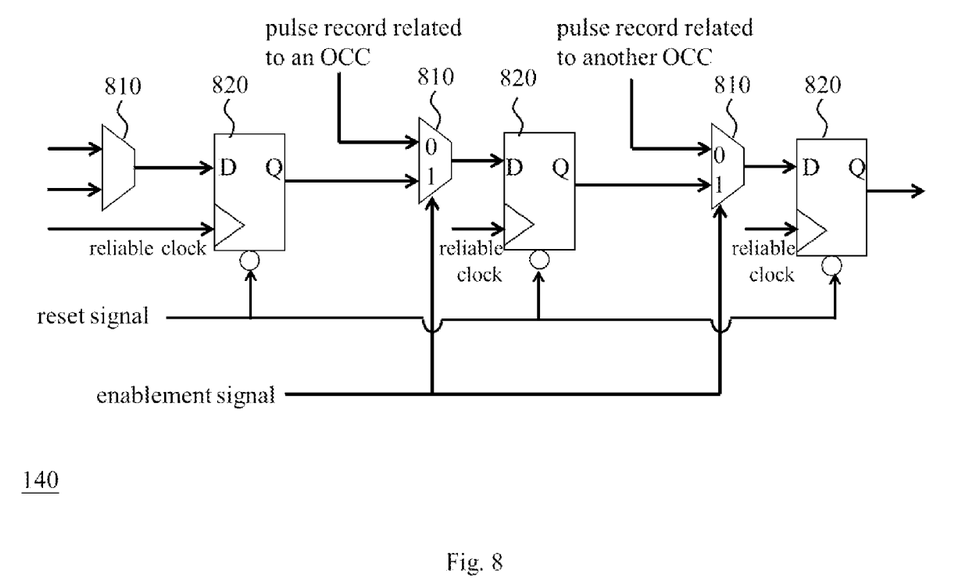
FIG. 8 shows an embodiment of the register circuit of FIG. 1.

FIG. 8 shows an embodiment of the register circuit 140. As shown in FIG. 8, when the aforementioned CUT includes several OCCs, the status of each OCC will be analyzed in the aforementioned test manner to generate a pulse record, and the register circuit 140 can include a plurality of multiplexers 810 and a plurality of shift registers 820 in this case. Each multiplexer 810 is configured to output the pulse record of an OCC to a shift register 820 when an enablement signal (e.g., the aforementioned scan enablement signal) is at a first signal level (e.g., "0"), and configured to transmit the pulse record stored in a shift register 820 when the enablement signal is at a second signal level (e.g., "1"). Each shift register 820 operates according to a reliable clock (e.g., a clock outputted by ATE, or a clock outputted by a crystal oscillator), and can be reset according to a rest signal. All the pulse records stored in the shift registers 820 can be outputted to a test apparatus (e.g., ATE) for analysis, and the test apparatus can determine whether the test status dependent upon the output clock of each OCC is abnormal according to the pulse records. Since each of the multiplexers 810 and the shift registers 820 alone is well known in this industrial field, people of ordinary skill in the art can appreciate the circuit operation of FIG. 8 according to FIG. 8 itself, and thus the detail is omitted here.

It should be noted that people of ordinary skill in the art can implement the present invention by selectively using some or all of the features of any embodiment in this specification or selectively using some or all of the features of two or more embodiments in this specification as long as such implementation is practicable, which implies that the present invention can be carried out flexibly.

To sum up, the present invention can verify whether the pulse number of the output clock of an OCC is correct, verify whether the frequency of the output clock is correct, and lower the frequency of the output clock to determine whether the previous frequency of the output clock is too high. As a result, the present invention can shorten the time for testing an integrated circuit and thereby reduce the cost.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A test device for testing an integrated circuit, the test device comprising:
   an on-chip-clock controller (OCC) configured to generate an output clock according to an input clock, in which the output clock is for testing a circuitry under test (CUT) included in the test device;
   a pulse debugging circuit configured to generate a pulse record according to a pulse number of the output clock, in which the pulse record is used to determine whether a test status dependent upon the output clock is abnormal; and
   a register circuit configured to store and output the pulse record according to a reliable clock.

2. The test device of claim 1, further comprising:
   a clock selecting circuit configured to output the output clock according to a plurality of clocks including at least one chip clock.

3. The test device of claim 2, wherein the plurality of clocks includes two different chip clocks, and the clock selecting circuit selects one of the two different chip clocks as the input clock, and selects the other one of the two different chip clocks as the input clock after the test status is found abnormal according to the pulse record.

4. The test device of claim 2, wherein the plurality of clocks includes the at least one chip clock and the reliable clock, the clock selecting circuit selects one of the at least one chip clock as the input clock, and selects the reliable clock as the input clock after the test status is found abnormal according to the pulse record.

5. The test device of claim 2, wherein the clock selecting circuit includes:
   a selecting circuit configured to select one of the plurality of clocks as a selected clock; and
   a frequency-dividing circuit configured to divide a frequency of the selected clock so as to generate a frequency-divided clock,
   in which the clock selecting circuit outputs the selected clock as the input clock first, and outputs the frequency-divided clock as the input clock after the test status is found abnormal according to the pulse record.

6. The test device of claim 1, further comprising:
   a clock observing circuit configured to generate a frequency-divided clock according to the output clock, in which the frequency-divided clock is used to determine whether a frequency of the output clock is correct.

7. The test device of claim 1, wherein the on-chip-clock controller includes a pulse enabler, and the pulse enabler is coupled to the pulse debugging circuit and configured to one or more control value of at least one signal provided for the pulse debugging circuit, in which the at least one input value is related to the pulse record.

8. The test device of claim 1, wherein the on-chip-clock controller includes a pulse enabler, and the pulse enabler is coupled to the pulse debugging circuit and configured to inform the pulse debugging circuit of a predetermined pulse number so that the pulse debugging circuit generates the pulse record according to the predetermined pulse number and the pulse number of the output clock.

9. The test device of claim 1, wherein the register circuit outputs the pulse record to a test apparatus so as to allow the test apparatus to determine whether a status of the on-chip-clock controller is correct according to the pulse record.

10. The test device of claim 9, wherein the reliable clock is from the test apparatus.

11. A test device for testing an integrated circuit, the test device comprising:
    an on-chip-clock controller (OCC) configured to generate an output clock according to an input clock, in which the output clock is for testing a circuitry under test (CUT) included in the test device; and
    a clock selecting circuit configured to generate the input clock according to one of a plurality of clocks, in which the plurality of clocks includes a chip clock and a reliable clock or the plurality of clocks includes two different chip clocks.

12. The test device of claim 11, wherein the plurality of clocks includes the two different chip clocks, and the clock selecting circuit selects one of the two different chip clocks as the input clock, and selects the other one of the two different chip clocks as the input clock after a test status dependent upon the output clock is found abnormal.

13. The test device of claim 11, wherein the plurality of clocks includes the chip clock and the reliable clock, and the clock selecting circuit firstly selects the chip clock as the input clock, and selects the reliable clock as the input clock after a test status dependent upon the output clock is found abnormal.

14. The test device of claim 11, wherein the clock selecting circuit includes:
    a selecting circuit configured to select one of the plurality of clocks as a selected clock; and
    a frequency-dividing circuit configured to divide a frequency of the selected clock so as to generate a frequency-divided clock,
    in which the clock selecting circuit outputs the selected clock as the input clock first, and outputs the frequency-divided clock as the input clock after a test status dependent upon the output clock is found abnormal.

15. The test device of claim 11, further comprising:
    a clock observing circuit configured to generate a frequency-divided clock according to the output clock, in which the frequency-divided clock is used to determine whether a frequency of the output clock conforms to predetermined frequency setting.

16. The test device of claim 15, wherein the clock observing circuit outputs the frequency-divided clock to a test apparatus so as to allow the test apparatus to determine whether the frequency-divided clock conforms to the predetermined frequency setting.

17. The test device of claim 16, wherein the reliable clock is from the test apparatus.

18. The test device of claim 16, further comprising:
    a pulse debugging circuit configured to generate a pulse record according a pulse number of the output clock, in which the pulse record is outputted to the test apparatus so as to allow the test apparatus to determine whether the pulse record conforms to predetermined pulse number setting.

19. The test device of claim 18, wherein when the pulse record does not conform to the predetermined pulse number setting, a test status dependent upon the output clock is found abnormal.

20. The test device of claim 11, wherein the plurality of clocks includes the chip clock and the reliable clock, and a frequency of the reliable clock is lower than a frequency of the chip clock.

* * * * *